United States Patent
T'ng et al.

(10) Patent No.: US 10,937,773 B2
(45) Date of Patent: Mar. 2, 2021

(54) IMAGE MODULE PACKAGE HAVING FLAT GLASS FILTER FLUSH WITH TRANSPARENT LAYER

(71) Applicant: PixArt Imaging Inc., Hsin-Chu County (TW)

(72) Inventors: Chee-Pin T'ng, Penang (MY); Sai-Mun Lee, Penang (MY)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 16/235,118

(22) Filed: Dec. 28, 2018

(65) Prior Publication Data

US 2019/0139951 A1 May 9, 2019

Related U.S. Application Data

(63) Continuation of application No. 14/453,199, filed on Aug. 6, 2014, now Pat. No. 10,211,191.

(51) Int. Cl.
| | |
|---|---|
| *H01L 25/16* | (2006.01) |
| *G01S 17/04* | (2020.01) |
| *G01J 1/02* | (2006.01) |
| *G01S 7/481* | (2006.01) |
| *G01J 3/02* | (2006.01) |
| *G01J 3/10* | (2006.01) |
| *H01L 25/00* | (2006.01) |

(52) U.S. Cl.
CPC .......... *H01L 25/167* (2013.01); *G01J 1/0214* (2013.01); *G01J 3/0227* (2013.01); *G01J 3/0256* (2013.01); *G01J 3/0262* (2013.01); *G01J 3/108* (2013.01); *G01S 7/4813* (2013.01); *G01S 17/04* (2020.01); *H01L 25/50* (2013.01); *H01L 2924/0002* (2013.01)

(58) Field of Classification Search
CPC ........... H01L 25/167; H01L 2924/0002; H01L 25/50; H01L 31/0203; H01L 27/14618; H01L 25/065–0657; H01L 25/105; G01J 3/0262; G01J 3/108; G01J 3/0227; G01J 3/0256; G01J 1/0214; G05B 2219/37284; G05B 2219/37103; G05B 2219/37286; G05B 2219/37277; G05B 2219/37279; G05B 2219/40569; G07C 2209/64; H03K 2217/945; H03K 2217/960755
See application file for complete search history.

(56) References Cited

U.S. PATENT DOCUMENTS

| | | | |
|---|---|---|---|
| 2008/0185508 A1* | 8/2008 | Cheng | H01L 27/14618 250/239 |
| 2014/0061447 A1* | 3/2014 | Campbell | G01S 17/04 250/221 |
| 2015/0279827 A1* | 10/2015 | Tu | H01L 31/0203 257/81 |

* cited by examiner

*Primary Examiner* — Nelson Garces
(74) *Attorney, Agent, or Firm* — Hauptman Ham, LLP

(57) ABSTRACT

There is provided an image module package including a substrate, a photo sensor chip, a molded transparent layer and a glass filter. The substrate has an upper surface. The photo sensor chip is attached to the upper surface of the substrate and electrically connected to the substrate. The molded transparent layer covers the photo sensor chip and a part of the upper surface of the substrate, wherein a top surface of the molded transparent layer is formed with a receptacle opposite to the photo sensor chip. The glass filter is accommodated in the receptacle.

18 Claims, 5 Drawing Sheets

IMAGE MODULE PACKAGE HAVING FLAT GLASS FILTER FLUSH WITH TRANSPARENT LAYER

RELATED APPLICATIONS

The present application is a continuation application of U.S. application Ser. No. 14/453,199, filed on Aug. 6, 2014, the disclosure of which is hereby incorporated by reference herein in its entirety.

BACKGROUND

1. Field of the Disclosure

This disclosure generally relates to an image module package and, more particularly, to an image module package and a manufacturing method thereof with a sub-assembly made by an over-molding process or a casting process.

2. Description of the Related Art

Light sensor modules, such as proximity sensors, ambient light sensors and color sensors generally detect light energy of a predetermined spectrum and output detected signals for post-processing by a processor.

In order to detect the predetermined spectrum, an organic or an inorganic filtering layer can be directly coated on a sensing surface of the photo sensor chip thereof, or a glass filter can be attached to the sensing surface.

For example, FIG. 1 is a solid diagram of the conventional light sensor module which includes a substrate 90. A photo sensor chip 91 and a light source 92 are disposed on the substrate 90, wherein the light source 92 is configured to illuminate an approaching object (not shown) and the photo sensor chip 91 is configured to detect reflected light from the approaching object. In order to allow the photo sensor chip 91 to have a good response to the spectrum of light emitted by the light source 92, a glass filter 93 is directly disposed on a pixel array of the photo sensor chip 91 so as to block ambient light.

However, inventors note that if the glass filter 93 is directly disposed on the sensing surface, the sensing surface can be damaged. Furthermore, the disposing of the glass filter 93 further has the alignment problem.

SUMMARY

Accordingly, the present disclosure provides an image module package and a manufacturing method thereof that incorporate an over-molding process or a casting process in the manufacturing process.

The present disclosure provides an image module package and a manufacturing method thereof that may simplify the manufacturing process and eliminate the mechanical damage to a sensing surface thereof.

The present disclosure further provides an image module package and a manufacturing method thereof that may improve the illumination efficiency of the light emitting die through a sub-assembly made by the over-molding process or casting process.

The present disclosure provides an image module package including a circuit board, a photo sensor chip, a first transparent layer, an opaque layer and a glass filter. The circuit board has an upper surface. The photo sensor chip is attached to the upper surface of the circuit board. The first transparent layer covers the photo sensor chip and a part of the upper surface of the circuit board, wherein a top surface of the first transparent layer has a receptacle opposite to the photo sensor chip. The opaque layer covers the first transparent layer and has a through hole opposite to the receptacle. The glass filter is accommodated in the receptacle. A part of a top surface of the glass filter is directly contacted and covered by the opaque layer.

The present disclosure further provides an image module package including a circuit board, a photo sensor chip, a light emitting die, a transparent layer, an opaque layer and a glass filter. The circuit board has an upper surface. The photo sensor chip and the light emitting die are attached to the upper surface of the circuit board. The transparent layer covers the photo sensor chip, the light emitting die and a part of the upper surface of the circuit board, wherein a top surface of the transparent layer has a receptacle opposite to the photo sensor chip. The opaque layer covers the transparent layer, and has a first through hole opposite to the photo sensor chip and a second through hole opposite to the light emitting die. The glass filter is accommodated in the receptacle. A top surface of the glass filter not aligned with the first through hole is directly contacted with the opaque layer.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

Figure 1:
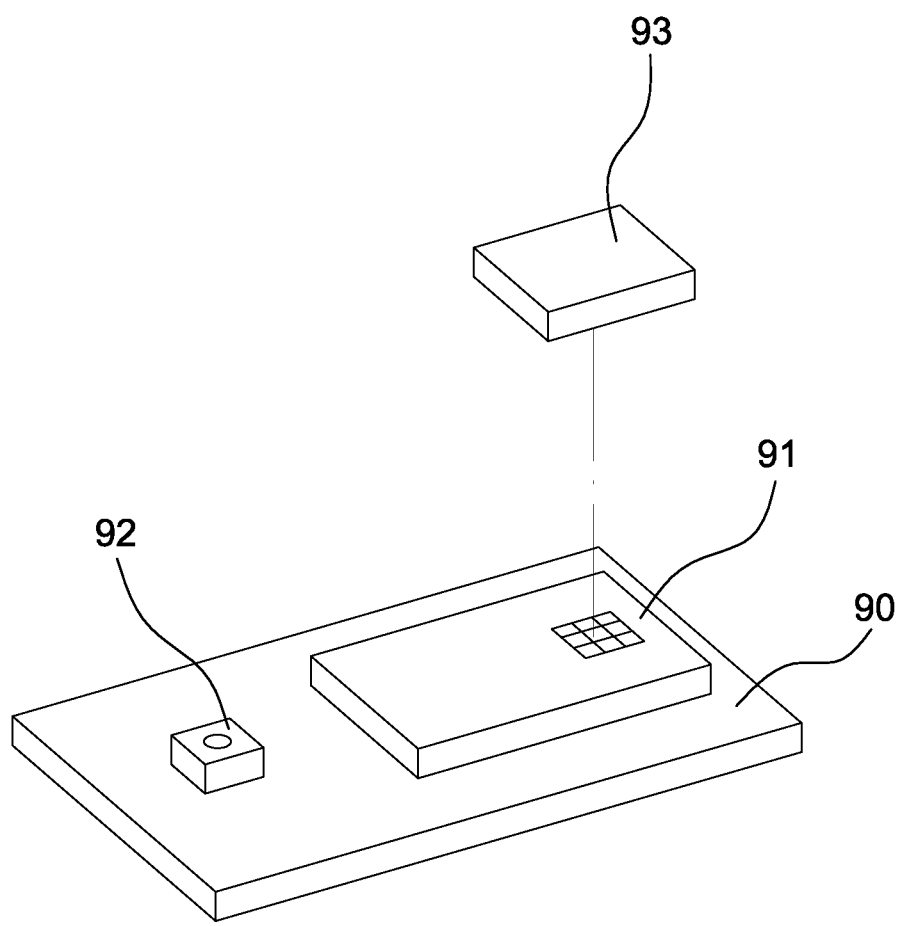
FIG. 1 is a solid diagram of the conventional light sensor module.
Figure 2:
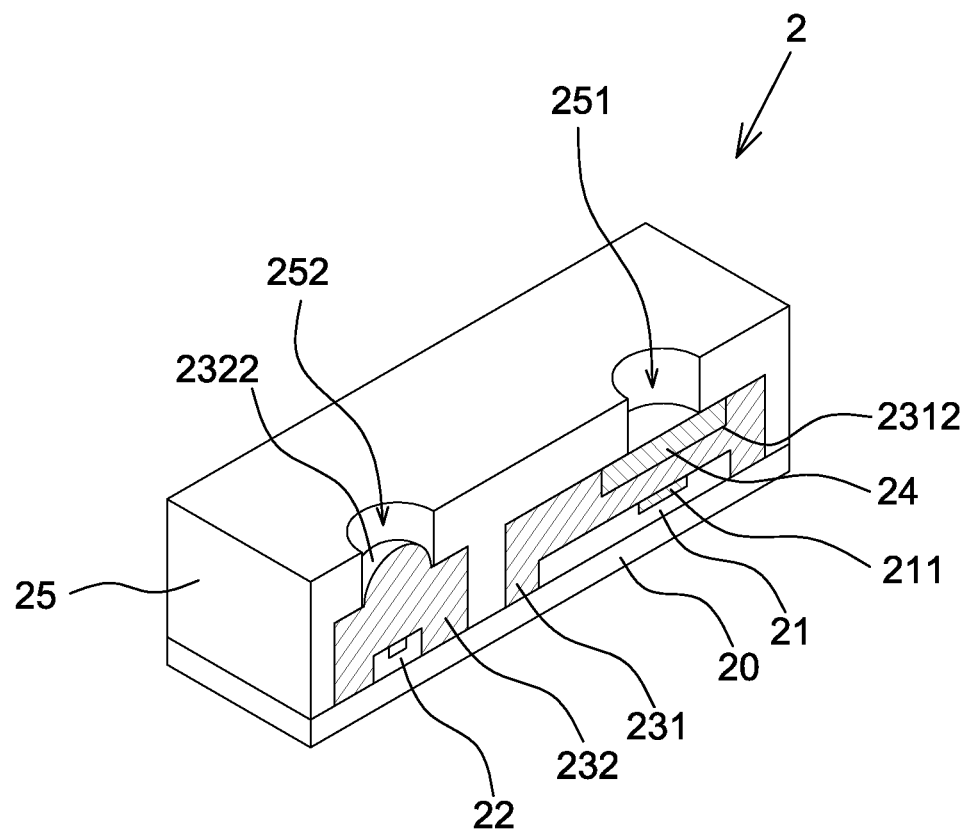
FIG. 2 is a cross-sectional view of the image module package according to one embodiment of the present disclosure.

Referring to FIG. 2, it is a cross-sectional view of the image module package 2 according to one embodiment of the present disclosure. The image module package 2 includes a substrate 20, a photo sensor chip 21, a light emitting die 22, a first molded transparent layer 231, a second molded transparent layer 232, a glass filter 24 and an opaque layer 25. In the image module package 2, the light emitting die 22 is configured to illuminate an object (not shown) and the photo sensor chip 21 is configured to receive reflected light from the object and convert the reflected light to electrical signals, wherein the object is, for example, a finger. In one embodiment, the photo sensor chip 21 directly performs the post-processing according to the converted electrical signals, e.g. calculating the object distance or ambient light intensity. In some embodiments, the photo sensor chip 21 transmits the converted electrical signals to an external processor for post-processing through the substrate 20.

The substrate 20 is, for example, a chip on board printed circuit board (COB PCB) which has the advantage of reducing failure due to warping of the chip on board package, but the present disclosure is not limited thereto as long as the substrate 20 is a suitable printed circuit board. The substrate 20 has an upper surface for disposing elements.

The photo sensor chip 21 is disposed on the upper surface of the substrate 20 and electrically connected to the substrate 20, wherein the photo sensor chip 21 is wire bonded to the substrate 20, but not limited thereto and any known chip bonding method may be used. The photo sensor chip 21 includes a pixel array 211 configured to convert light energy to electrical signals, and the pixel array 211 is consisted of, for example, a plurality of photodiodes arranged in a matrix. The pixel array 211 is formed on a sensing surface of the photo sensor chip 21.

The light emitting die 22 is, for example, a light emitting diode die (LED die) or a laser diode die which is disposed on the upper surface of the substrate 20 and electrically connected to the substrate 20, wherein the light emitting die 22 is wire bonded to the substrate 20, but not limited thereto and any known die bonding method may be used. The light emitting die 22 emits light of a wavelength of about 940 nm, but not limited thereto and other invisible light may be used.

The first molded transparent layer 231 covers the photo sensor chip 21 and a part of the upper surface of the substrate 20 through an over-molding process or a casting process. In one embodiment, a top surface of the first molded transparent layer 231 is a flat surface that is substantially parallel to the upper surface of the substrate 20. The top surface of the first molded transparent layer 231 is formed with a receptacle 2312 opposite to the photo sensor chip 21 configured to accommodate the glass filter 24. It should be mentioned that although FIG. 2 shows that the receptacle 2312 is a rectangular shape, but the present disclosure is not limited thereto. The shape of the receptacle 2312 is determined according to a shape of the glass filter 24. For example, when the glass filter 24 is a circular plate, the receptacle 2312 has a circular shape, and the depth thereof is determined according to the glass filter 24 to be accommodated. Preferably, an area of the receptacle 2312 is at least larger than that of the pixel array 211.

In one embodiment, a transmitting spectrum of the glass filter 24 is between 920 nm and 960 nm, but not limited thereto. The transmitting spectrum of the glass filter 24 is determined according to an emission spectrum of the light emitting die 22. The glass filter 24 is secured in the receptacle 2312 through, for example, the transparent adhesive.

The second molded transparent layer 232 covers the light emitting die 22 and a part of the upper surface of the substrate 20 through the over-molding process or casting process. In one embodiment, in order to improve the illumination efficiency of the light emitting die 22, a top surface of the second molded transparent layer 232 is formed with a light guiding structure 2322 opposite to the light emitting die 22, wherein the light guiding structure 2322 has a curved surface, e.g. a convex dome or a concave depression, and integrally formed with the second molded transparent layer 232.

In addition, in order to avoid the light emitted by the light emitting die 22 directly being received by the photo sensor chip 21 through the molded transparent layer, the first molded transparent layer 231 and the second molded transparent layer 232 are separated from each other, e.g. separately formed during manufacturing, or simultaneously formed and then cut into two parts In some embodiments, in order to prevent ambient light from being received by the photo sensor chip 21 to cause the interference, the image module package 2 further includes an opaque layer 25 covering the first molded transparent layer 231 and the second molded transparent layer 232, and the opaque layer 25 includes two through holes 251 and 252 at a top surface thereof and respectively opposite to the receptacle 2312 (or the glass filter 24) and the light guiding structure 2322 (or the light emitting die 22). In one embodiment, the opaque layer 25 is a cover which is formed separately and covered on the first molded transparent layer 231 and the second molded transparent layer 232 when the image module package 2 is manufactured. In another embodiment, the opaque layer 25 is a molded light blocking layer which is coved on the first molded transparent layer 231 and the second molded transparent layer 232 through the over-molding process or casting process. As mentioned above, in order to further prevent the light emitted from the light emitting die 22 from propagating to the photo sensor chip 21, the opaque layer 25 extends to the upper surface of the substrate 20 through a groove between the photo sensor chip 21 and the light emitting die 22.

Referring to FIGS. 3A-3E, they are solid diagrams of the manufacturing process of the image module package according to one embodiment of the present disclosure, and details thereof are described hereinafter.

Figure 3A:
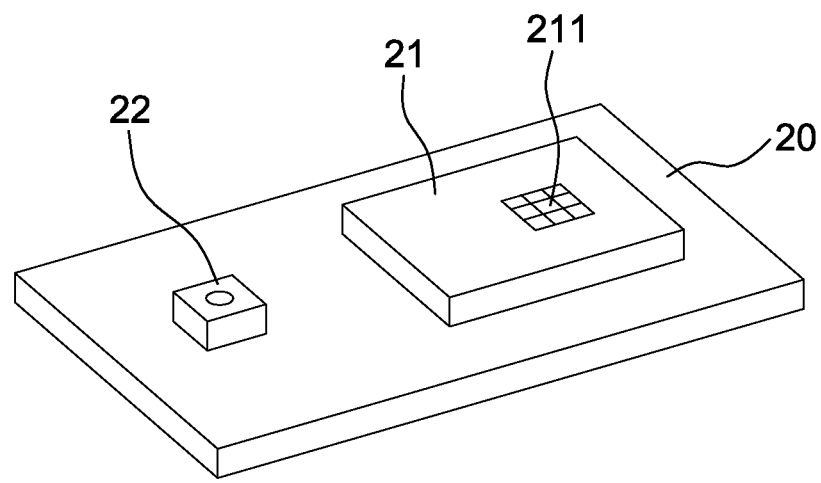
FIGS. 3A-3E are solid diagrams of the manufacturing process of the image module package according to one embodiment of the present disclosure.

Referring to FIG. 3A, after the printed circuit board 20 is cleaned, a photo sensor chip 21 and a light emitting die 22 are attached to an upper surface of the printed circuit board 20. Next, the photo sensor chip 21 and the light emitting die 22 are electrically connected to the printed circuit board 20, e.g. through wire bonding, but not limited thereto. Other known bonding methods may be used.

Figure 3B:
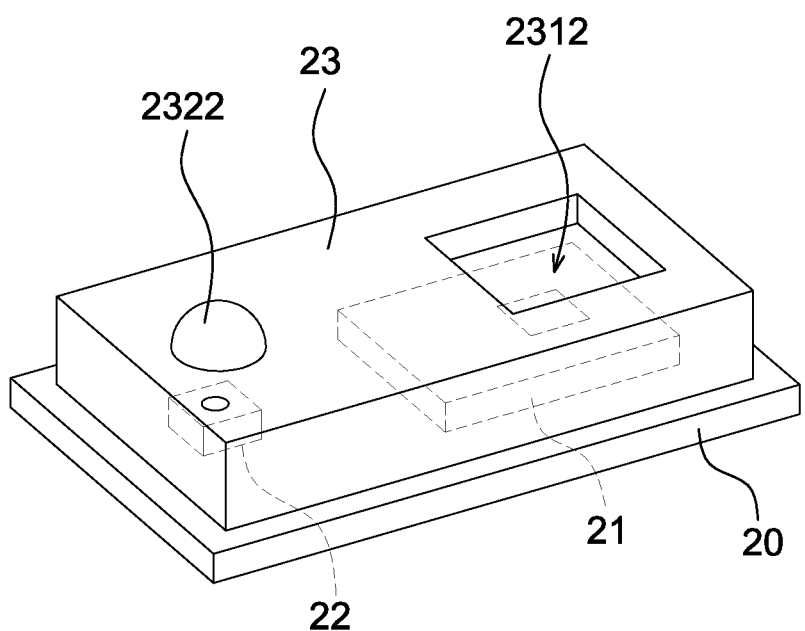

Referring to FIG. 3B, a transparent layer 23 is molded on the photo sensor chip 21 and the light emitting die 22, in some embodiments covering a part of the upper surface of the substrate 20, by the over-molding process or casting process, wherein a top surface of the transparent layer 23 is formed with a receptacle 2312 in the molding process opposite to the photo sensor chip 21. The receptacle 2312 is for accommodating a glass filter and thus a shape of the receptacle 2312 is determined according to that of the glass filter and is not limited to that shown in FIG. 3B.

It is appreciated that said molding process is implemented by the steps of: covering a mold on the substrate 20 and accommodating the photo sensor chip 21 and the light emitting die 22 in the cavity of the mold; injecting fluid material into the cavity; and removing the mold to leave the molded transparent layer 23 covering the photo sensor chip 21 and the light emitting die 22 after the fluid material is cured, wherein the shape of the cavity is previously determined according to the shape of the transparent layer 23 to be made.

In some embodiments, a top surface of the transparent layer 23 is further formed with a light guiding structure 2322, which is a convex or concave surface, opposite to the light emitting die 22 for improving the illumination efficiency. In some embodiments, when the light emitting die 22 has a good light emission pattern, the light guiding structure 2322 may not be implemented.

Figure 3C:
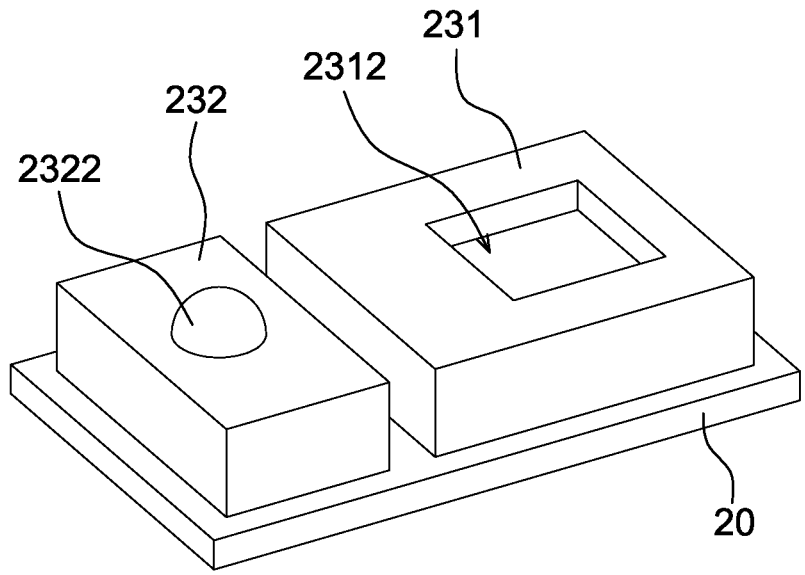

Referring to FIG. 3C, a diamond blade is then used to cut between the photo sensor chip 21 and the light emitting die 22 so as to divide the transparent layer 23 into two parts, e.g. a first transparent layer 231 and a second transparent layer 232. In this manner, the light emitted from the light emitting die 22 is not received by the photo sensor chip 21 directly through the transparent layer 23 to cause the interference.

In another embodiment, the first transparent layer 231 and the second transparent layer 232 are respectively formed on the printed circuit board 20 through the over-molding process or casting process. In this embodiment, a first transparent layer 231 is molded on the photo sensor chip 21 and covering a part of the upper surface of the substrate 20, wherein a top surface of the first transparent layer 231 is also formed with a receptacle 2312 opposite to the photo sensor chip 21; and a second transparent layer 232 is molded on the light emitting die 22 and covering a part of the upper surface of the substrate 20, wherein a top surface of the second transparent layer 232 is optionally formed with a light guiding structure 2322. Accordingly, this embodiment does not include the step of FIG. 3B, i.e. the transparent layer 23 not being cut.

In other words, in the embodiment of the present disclosure the first transparent layer 231 and the second transparent layer 232 are formed simultaneously or sequentially and separated from each other.

Figure 3D:
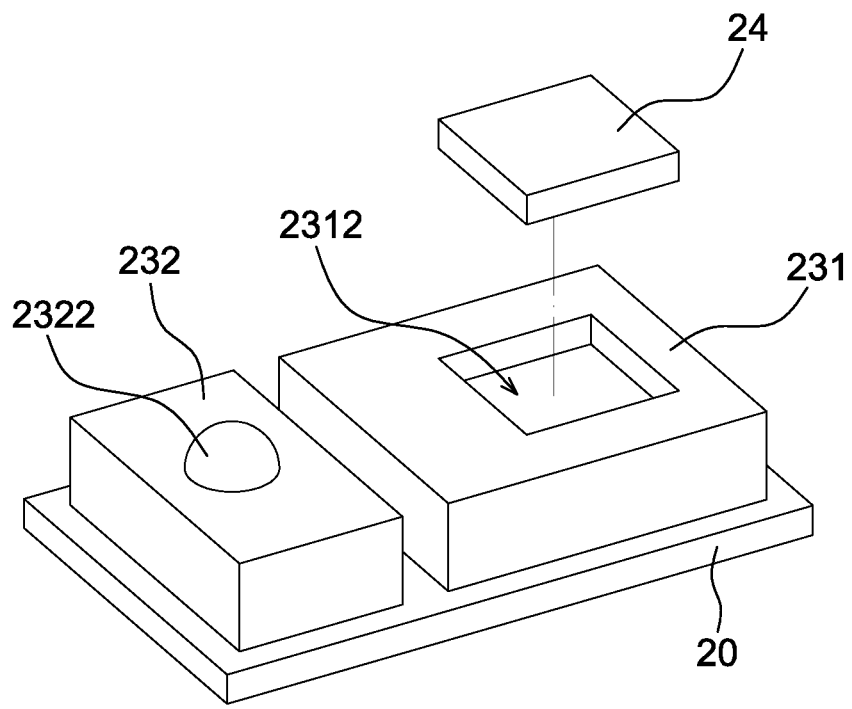

Referring to FIG. 3D, next a glass filter 24 is disposed in the receptacle 2312 and secured in the receptacle 2312 through the transparent adhesive. As the receptacle 2312 is aligned with the photo sensor chip 21 when it is formed, the alignment procedure is accomplished at the same time when the glass filter 24 is accommodated in the receptacle 2312.

Figure 3E:
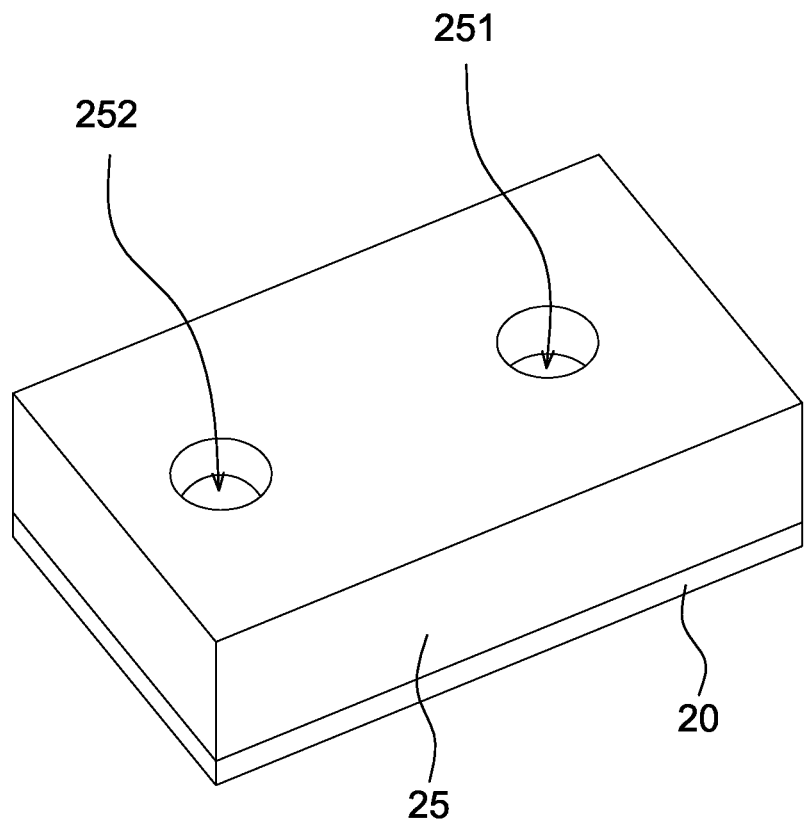

Referring to FIG. 3E, finally an opaque layer 25, e.g. an opaque cover or a light blocking layer molded through the over-molding process or casting process, is covered outside of the transparent layer 23 (or the first transparent layer 231 and the second transparent layer 232). The opaque layer 25 includes two through holes 251 and 252 respectively opposite to the photo sensor chip 21 and the light emitting die 22 to allow the module light to eject via the through hole 252 and allow the reflected light to enter the image module package 20 via the through hole 251.

In addition, in the above processes when the adhesive is used, e.g. die attachment and disposition of the glass filter, a curing process is further included.

It should be mentioned that although the above embodiments show only one image module package being formed on a printed circuit board 20, the present disclosure is not limited thereto. In actual manufacturing, a plurality of image module packages may be formed on one printed circuit board 20 simultaneously, and after the step shown in FIG. 3E is accomplished, the image module packages are then singulated by a cutting process.

It should be mentioned that although in the above embodiments the image module package includes both the photo sensor chip 21 and the light emitting die 22, the present disclosure is not limited thereto. According to different applications, the image module package 2 includes only the photo sensor chip 21 but does not include the light emitting die 22. For example, in an image system including an external light source, the image module package 2 may not include the light emitting die 22, and in this embodiment only the descriptions regarding the light emitting die 22, the second molded transparent layer 232 and the opaque layer outside the second molded transparent layer 232 in the above embodiment are ignored, but other parts are the same.

As mentioned above, in the conventional light sensor package because the glass filter is directly disposed on the pixel array of the photo sensor chip, it has the problem that the photo sensor chip can be damaged and the alignment of the glass filter is not easy. Therefore, the present disclosure further provides an image module package (FIG. 2) and a manufacturing method thereof (FIGS. 3A-3E) that form a transparent sub-assembly (i.e. transparent layer) directly on the photo sensor chip by means of the over-molding process or casting process such that a glass filter is not directly disposed on the photo sensor chip, wherein the transparent sub-assembly is directly formed with a receptacle in manufacturing so as to simplify the disposition of the glass filter. In addition, a light guiding structure is optionally formed on the transparent sub-assembly so as to improve the operating performance of the image module package.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An image module package, comprising:
    a circuit board having an upper surface;
    a photo sensor chip attached to the upper surface of the circuit board;
    a first transparent layer covering the photo sensor chip and a part of the upper surface of the circuit board, wherein a top surface of the first transparent layer has a receptacle opposite to the photo sensor chip;
    an opaque layer covering the first transparent layer and having a through hole opposite to the receptacle; and
    a glass filter accommodated in the receptacle, and secured by transparent adhesive in the receptacle of the first transparent layer,
    wherein a part of a top surface of the glass filter is directly contacted and covered by the opaque layer, and the whole top surface of the glass filter is a flat rectangle surface which has a same height as the top surface of the first transparent layer.

2. The image module package as claimed in claim 1, further comprising a light emitting die attached to the upper surface of the circuit board.

3. The image module package as claimed in claim 2, further comprising a second transparent layer covering the light emitting die and another part of the upper surface of the circuit board.

4. The image module package as claimed in claim 3, wherein the first transparent layer and the second transparent layer are separated from each other.

5. The image module package as claimed in claim 3, wherein a top surface of the second transparent layer has a light guiding structure opposite to the light emitting die.

6. The image module package as claimed in claim 5, wherein the opaque layer covers the first transparent layer and the second transparent layer, and the opaque layer has another through hole opposite to the light guiding structure.

7. The image module package as claimed in claim 6, wherein the opaque layer is a cover or a molded light blocking layer.

8. The image module package as claimed in claim 6, wherein the light guiding structure is a convex dome and accommodated in the another through hole.

9. The image module package as claimed in claim 5, wherein the light guiding structure is integrally formed with the second transparent layer.

10. The image module package as claimed in claim 1, wherein a shape of the receptacle is a circular shape or a rectangular shape, and a transmitting spectrum of the glass filter is between 920 nm and 960 nm .

11. The image module package as claimed in claim 1, wherein the glass filter fully fits in the receptacle.

12. An image module package, comprising:
    a circuit board having an upper surface;
    a photo sensor chip attached to the upper surface of the circuit board;
    a light emitting die attached to the upper surface of the circuit board;

a transparent layer covering the photo sensor chip, the light emitting die and a part of the upper surface of the circuit board, wherein a top surface of the transparent layer has a receptacle opposite to the photo sensor chip;

an opaque layer covering the transparent layer, and having a first through hole opposite to the photo sensor chip and a second through hole opposite to the light emitting die; and a glass filter accommodated in the receptacle, and secured by transparent adhesive in the receptacle of the transparent layer, wherein a part of a top surface of the glass filter not aligned with the first through hole is directly contacted with the opaque layer, and the whole top surface of the glass filter is a flat rectangle surface which has a same height as the top surface of the transparent layer.

13. The image module package as claimed in claim 12, wherein the transparent layer is separated into two parts by a wall protruding from the opaque layer.

14. The image module package as claimed in claim 12, wherein the top surface of the transparent layer further has a light guiding structure accommodated in the second through hole.

15. The image module package as claimed in claim 14, wherein the opaque layer is a cover or a molded light blocking layer.

16. The image module package as claimed in claim 14, wherein the light guiding structure is integrally formed with the transparent layer.

17. The image module package as claimed in claim 12, wherein a shape of the receptacle is a circular shape or a rectangular shape, and a transmitting spectrum of the glass filter is between 920 nm and 960 nm.

18. The image module package as claimed in claim 12, wherein the photo sensor chip comprises a pixel array arranged under the glass filter.

* * * * *